(12) United States Patent
Lee et al.

(10) Patent No.: US 8,025,953 B2
(45) Date of Patent: Sep. 27, 2011

(54) METHOD FOR PREPARING CONDUCTIVE PATTERN AND CONDUCTIVE PATTERN PREPARED BY THE METHOD

(75) Inventors: Dong Wook Lee, Daejeon (KR); In Seok Hwang, Daejeon (KR); Seung Wook Kim, Incheon (KR); Hyun Seok Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 347 days.

(21) Appl. No.: 12/086,613

(22) PCT Filed: Dec. 15, 2006

(86) PCT No.: PCT/KR2006/005504
§ 371 (c)(1),
(2), (4) Date: Jun. 16, 2008

(87) PCT Pub. No.: WO2007/069870
PCT Pub. Date: Jun. 21, 2007

(65) Prior Publication Data
US 2009/0117342 A1    May 7, 2009

(30) Foreign Application Priority Data
Dec. 16, 2005 (KR) .................. 10-2005-0124866

(51) Int. Cl.
*B32B 9/00* (2006.01)
*H05K 3/00* (2006.01)
(52) U.S. Cl. ....... 428/209; 174/257; 427/99.2; 427/99.5
(58) Field of Classification Search .................. 174/135, 174/257; 428/209; 427/99.2, 99.5
See application file for complete search history.

(56) References Cited

U.S. PATENT DOCUMENTS

| | | | |
|---|---|---|---|
| 4,263,109 A | 4/1981 | Swinkels et al. | |
| 4,970,107 A | 11/1990 | Akahoshi et al. | |
| 6,086,979 A * | 7/2000 | Kanbara et al. | 428/209 |
| 6,448,492 B1 * | 9/2002 | Okada et al. | 174/389 |
| 6,621,003 B2 * | 9/2003 | Yoshida et al. | 174/389 |
| 7,655,873 B2 * | 2/2010 | Choi | 174/350 |
| 7,749,620 B2 * | 7/2010 | Yoshida et al. | 427/128 |
| 7,749,686 B2 * | 7/2010 | Ichiki et al. | 430/311 |

FOREIGN PATENT DOCUMENTS

| | | |
|---|---|---|
| JP | 09-321443 | 12/1997 |
| JP | 10-294501 | 11/1998 |
| JP | 2000-013088 | 1/2000 |
| JP | 2002-299779 | 10/2002 |
| JP | 2003-110222 | 4/2003 |
| JP | 2004-320025 | 11/2004 |
| KR | 2001-210988 | 8/2001 |
| KR | 1020040043936 A | 5/2004 |
| KR | 1020040072993 A | 8/2004 |
| KR | 1020040088696 A | 10/2004 |
| KR | 2005-0116570 | 12/2005 |
| KR | 1020060032246 A | 4/2006 |
| WO | WO 2005/013664 A1 | 2/2005 |

* cited by examiner

*Primary Examiner* — Cathy Lam
(74) *Attorney, Agent, or Firm* — McKenna, Long & Aldridge LLP

(57) ABSTRACT

The present invention provides a method for preparing a conductive pattern, comprising a pattern forming step of forming a conductive pattern on a substrate; and a blackening processing step of blackening the surface of the conductive pattern by immersing the conductive pattern in an aqueous solution containing reducing metal ions to oxidize the surface of the conductive pattern, and a conductive pattern prepared therefrom.

21 Claims, 1 Drawing Sheet

[Fig. 1]
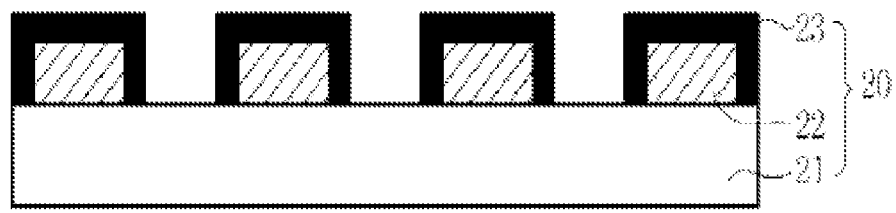
[Fig. 2]
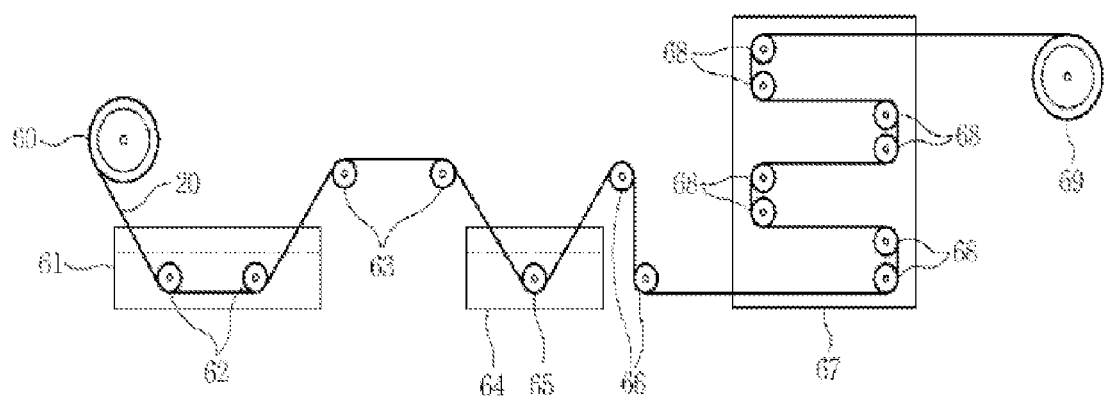
[Fig. 3]
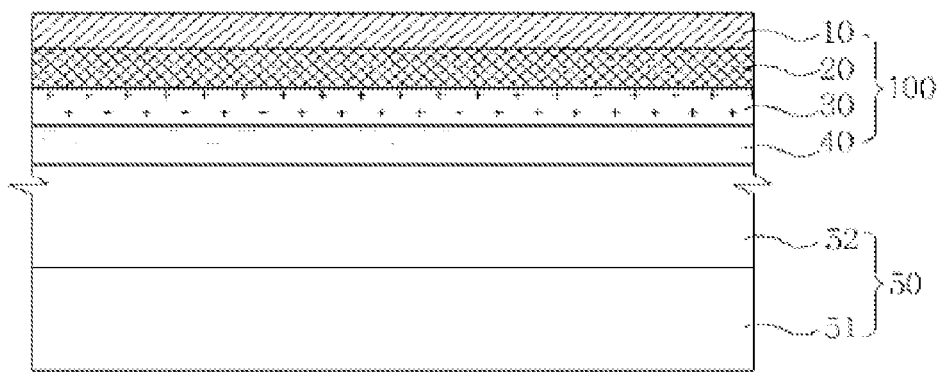

METHOD FOR PREPARING CONDUCTIVE PATTERN AND CONDUCTIVE PATTERN PREPARED BY THE METHOD

This application claims the benefit of International Application Number PCT/KR/2006/005504 filed on Dec. 15, 2006 and Korean Application No. 10-2005-0124866 filed on Dec. 16, 2005, both of which are hereby incorporated by reference as if fully set forth herein.

TECHNICAL FIELD

The present invention relates to a method for preparing a conductive pattern, which sufficiently blackens the conductive pattern, reduces the sheet resistance, and allows easy blackening processing of the conductive pattern, thereby improving the productivity and reducing the production cost, and to a conductive pattern prepared therefrom.

This application claims priority benefits from Korean Patent Application No. 10-2005-0124866, filed on Dec. 16, 2005, the entire content of which is fully incorporated herein by reference.

BACKGROUND ART

Generally, the term "display device" comprehensively refers to monitors for TV, computers, or the like, and includes a display assembly containing a display panel for forming image, and a casing for supporting the display assembly.

The display assembly includes a display panel such as CRT (Cathode Ray Tube), LCD (Liquid Crystal Display) and PDP (Plasma display Panel) for forming image, a circuit board for driving the display panel and an optical filter disposed in front of the display panel.

The optical filter comprises an anti-reflection film for preventing the external light incident from the outside from be reflected outward again, a near infrared ray shielding film for shielding the near infrared ray generated in the display panel for prevention of misoperation of an electronic instrument such as a remote controller, a color correction film for enhancing the color purity through control of the shade by incorporation of a color adjusting dye, and an EMI (electromagnetic interference) shielding film for shielding the EMI (electromagnetic interference) generated in the display panel upon driving the display device.

As used herein, the EMI (electromagnetic interference) shielding film comprises a substrate made from transparent materials, and a conductive pattern made from metallic materials patterned by a photolithography process, having excellent electric conductivity such as silver and copper.

Since the conductive pattern is provided with high-gloss metal materials, light incident from the outside is reflected, or the image light from the display panel is reflected, which may cause reduction of the contrast ratio. As such, in order to inhibit such effect, the surface of the conductive pattern is generally subject to blackening processing. That is, the conductive pattern is usually blackened.

As a blackening processing for a conductive pattern, KR Patent Application Publication No. 2004-0072993 discloses a process for blackening processing of a mesh using chemicals such as concentrated nitric acid after forming the mesh on a metal foil by photolithography.

Further, Japanese Patent Application Publication No. 2001-210988 discloses a process for blackening processing of the surface of a mesh formed by photolithography, using concentrated nitric acid.

However, these processes for blackening processing of a conductive pattern have problems that after forming a conductive pattern, the conductive pattern is required to be treated with concentrated nitric acid, leading to deteriorated workability.

Moreover, if the conductive pattern is blackened, there are provided problems that the processing time is too long, and that sufficient degree of blackness cannot be obtained. Further, there is also a problem that the sheet resistance of the conductive pattern affecting the ability of shielding the EMI (electromagnetic interference) is increased.

DISCLOSURE OF INVENTION

Technical Problem

It is an object of the present invention to provide a method for preparing a conductive pattern, wherein sufficiently blackens the conductive pattern, reduces the sheet resistance, and allows easy blackening processing of the conductive pattern, thereby improving the productivity and reducing the production cost, and a conductive pattern prepared therefrom.

Technical Solution

In order to overcome the above-described problems, one embodiment of the present invention provides a method for preparing a conductive pattern, comprising a pattern forming step of forming a conductive pattern on a substrate; and a blackening processing step of blackening the surface of the conductive pattern by immersing the conductive pattern in an aqueous solution containing reducing metal ions to oxidize the surface of the conductive pattern.

Another embodiment of the present invention provides a conductive pattern prepared by the above-described preparation process.

Still another embodiment of the present invention provides an EMI (electromagnetic interference) shielding film comprising the above-described conductive pattern.

Still another embodiment of the present invention provides an optical filter for a display device comprising the above-described EMI (electromagnetic interference) shielding film.

Still another embodiment of the present invention provides a conductive pattern, comprising a conductive pattern layer formed on a substrate; and a blackened layer formed on the surface of the conductive pattern layer by immersing the conductive pattern layer in an aqueous solution containing reducing metal ions for oxidizing the surface of the conductive pattern layer.

Still another embodiment of the present invention provides an EMI (electromagnetic interference) shielding film comprising the above-described conductive pattern.

Hereinbelow, the present invention will be described in detail.

In one embodiment of the present invention, the method for preparing a conductive pattern comprises a pattern forming step of forming a conductive pattern on a substrate; and a blackening processing step of blackening the surface of the conductive pattern by immersing the conductive pattern in an aqueous solution containing reducing metal ions to oxidize the surface of the conductive pattern.

The substrate can be formed of at least one resin selected from a polyacrylic resin, a polyurethane resin, a polyester resin, a polyepoxy resin, a polyolefin resin, a polycarbonate resin and a cellulose resin.

In the pattern forming step, the conductive pattern can comprise at least one selected from copper(Cu), silver(Ag), gold(Au) and aluminum(Al).

The conductive pattern is preferably a silver(Ag) conductive pattern comprising silver(Ag) powders.

The silver(Ag) conductive pattern can be formed by directly printing a conductive paste containing silver(Ag) powders on the substrate. For this, any method selected from an off-set printing method, a screen printing method, a gravure printing method and an ink-jet printing method can be used. In addition, any printing method well-known to a skilled person in the art, in which a conductive paste can be directly printed on a substrate, can be employed.

Among the printing methods, the off-set printing method can comprise the steps of: filling the conductive paste in the concave part formed on a concave plate; contacting a printing blanket with the concave plate to transfer the conductive paste from the concave part of the concave plate to the printing blanket; and contacting the printing blanket with the substrate, and transferring the conductive paste from the printing blanket to the substrate to form a conductive pattern on the substrate. Here, a convex plate can be used instead of the concave plate.

In an aqueous solution containing the reducing metal ions used in the blackening processing step, the term "reducing metal ion" means a metal ion which exhibits a phenomenon that oxidation number was decreased by receiving electrons from the conductive pattern in contact with the conductive pattern in the present invention.

In the blackening processing step, the aqueous solution containing the reducing metal ions may be an aqueous solution containing Fe or Cu ions as the reducing metal ions. Here, the reducing metal ions are not limited to Fe and Cu, but a variety of reducing metal ions which can satisfy the condition of oxidizing the surface of the conductive pattern can be variously employed.

In the blackening processing step, by immersing the conductive pattern in an aqueous solution containing the reducing metal ions, the surface of the conductive pattern is oxidized by reduction of the reducing metal ions, whereby the conductive pattern can be sufficiently blackened.

The aqueous solution containing the reducing metal ions can further comprise Cl ions, in addition to the reducing metal ions.

If the aqueous solution containing the reducing metal ions further comprises Cl ions, the silver(Ag) conductive pattern is immersed in the aqueous solution containing the Cl ions and the reducing metal ions, to cause a crystal growth phenomenon by the Cl ions. Accordingly, chlorine salt (Cl salt) crystals are formed on the surface of the conductive pattern.

As such, if the chlorine salt (Cl salt) crystals are formed on the surface of the conductive pattern, the sheet resistance ($\Omega/\square$) of the conductive pattern is reduced, and correspondingly the conductance is enhanced.

Specifically, the aqueous solution containing the reducing metal ions can be selected from an aqueous $FeCl_3$ solution, an aqueous $CuCl_2$ solution, an aqueous $K_3Fe(CN)_6$ solution and an aqueous $K_3Fe(CN)_6$ solution added with a solution containing Cl ions. In addition, as the aqueous solution containing the reducing metal ions, an aqueous FeCl solution can be used.

The aqueous FeCl solution may comprise 0.01 to 50% by weight of FeCl and balance q. s. to 100% by weight of water, based on the total weight.

The aqueous $CuCl_2$ solution may comprise 0.01 to 50% by weight of $CuCl_2$ and balance q. s. to 100% by weight of water, based on the total weight.

The aqueous $K_3Fe(CN)$ solution may comprise 0.01 to 50% by weight of $K_3Fe(CN)_6$ and balance q. s. to 100% by weight of water, based on the total weight.

If the aqueous $K_3Fe(CN)_6$ solution is added with a solution containing Cl ions, the aqueous $K_3Fe(CN)$ solution may comprise 0.01 to 50% by weight of $K_3Fe(CN)_6$, 0.01 to 50% by weight of the solution containing Cl ions, and balance q. s. to 100% by weight of water, based on the total weight. Here, the solution containing Cl ions added to the aqueous $K_3Fe(CN)_6$ solution is preferably HCl, but is not limited thereto.

In one example of the method for preparing a conductive pattern according to the present invention, the conductive pattern is a silver(Ag) conductive pattern obtained by directly printing a conductive paste comprising silver(Ag) powders on the substrate, and if the silver(Ag) conductive pattern is immersed in an aqueous solution containing Fe or Cu ions as the reducing metal ions, the surface of silver(Ag) conductive pattern is oxidized by reduction of the Fe or Cu ions, thereby allowing sufficient blackening processing of the silver(Ag) conductive pattern, in the blackening processing step.

In another example of the method, the conductive pattern is a silver (Ag) conductive pattern obtained by directly printing a conductive paste comprising silver(Ag) powders on the substrate, and if the aqueous solution containing the reducing metal ions further comprises Cl ions, if the silver (Ag) conductive pattern is immersed in an aqueous solution containing the Cl ions and the reducing metal ions, AgCl crystal growth occurs by the Cl ions, whereby AgCl crystals are formed on the surface of the silver(Ag) conductive pattern, in the blackening processing step.

As such, if the AgCl crystals are grown on the surface of the silver (Ag) conductive pattern, the sheet resistance ($\Omega/\square$) of the silver(Ag) conductive pattern is reduced, and correspondingly the conductance is enhanced.

Here, examples of the aqueous solution containing the reducing metal ions and Cl ions may include an aqueous FeCl solution, an aqueous $CuCl_2$ solution, and an aqueous $K_3Fe(CN)_6$ solution added with a solution containing Cl ions. Here, the solution containing Cl ions added to the aqueous $K_3Fe(CN)_6$ solution is preferably HCl, but is not limited thereto. Further, even if the silver(Ag) conductive pattern is immersed in the aqueous FeCl solution, AgCl crystals are formed on the surface of the silver(Ag) conductive pattern. Thus, the sheet resistance ($\Omega/\square$) of the silver(Ag) conductive pattern can be reduced, and correspondingly the conductance can be enhanced.

Examples of the aqueous solution containing the reducing metal ions and the Cl ions are not limited thereto, but various other aqueous solutions comprising the Cl ions for allowing formation of the AgCl crystals on the surface of the silver(Ag) conductive pattern and the reducing metal ions for oxidation of the surface of the silver(Ag) conductive pattern can be used.

In the blackening processing step, the conductive pattern can be immersed in the aqueous solution containing the reducing metal ions for 3 to 300 seconds.

The method for preparing a conductive pattern according to the present invention can further comprise a washing step of washing the conductive pattern blackened in the blackening processing step; and a drying step of drying the conductive pattern washed in the washing step.

In the drying step, the conductive pattern can be dried at 50 to 120° C. for 3 to 10 minutes.

The blackening processing step, the washing step and the drying step can be successively carried out by a plurality of rollers.

In the blackening processing step, the aqueous solution containing the reducing metal ions can be received in the blackening processing bath, the washing liquid used in the washing step can be received in the washing treatment bath, and the drying step can be carried out in the drying treatment bath.

The plurality of the rollers can include a blackening processing roller which is provided in the blackening processing bath and introduces a conductive pattern formed in the pattern forming step to the blackening processing bath; a washing treatment roller which is provided in the washing treatment bath and introduces conductive pattern blackened in the blackening processing bath to the washing treatment bath; and a drying treatment roller which is provided in the drying treatment bath, and introduces the conductive pattern washed in the washing treatment bath to the drying treatment bath.

Further, a first guide roller can be provided between the blackening processing roller and the washing treatment roller, and a second guide roller can be provided between the washing treatment roller and the drying treatment roller.

In another embodiment of the present invention, the conductive pattern can be prepared by the above-mentioned preparation process according to the present invention.

In still another embodiment of the present invention, the EMI (electromagnetic interference) shielding film comprises the conductive pattern according to the present invention.

In still another embodiment of the present invention, the optical filter for a display device comprises the EMI (electromagnetic interference) shielding film.

The optical filter for a display device can further comprise at least one selected from an anti-reflection film for preventing the external light incident from the outside from be reflected outward again, a near infrared ray shielding film for shielding the near infrared ray, and a color correction film for enhancing the color purity through control of the shade by incorporation of a color adjusting dye.

In still another embodiment of the present invention, the conductive pattern comprises a conductive pattern layer formed on a substrate; and a blackened layer formed on the surface of the conductive pattern layer by immersing the conductive pattern layer in an aqueous solution containing reducing metal ions for oxidizing the surface of the conductive pattern layer. The above description on the method for preparing a conductive pattern according to the present invention is applied on the present embodiments by its entirety.

Advantageous Effects

According to the present invention, the conductive pattern can be sufficiently blackened. Further, the sheet resistance of the conductive pattern can be reduced, and correspondingly the conductance can be enhanced. In addition, the blackening processing of the conductive pattern is easy, whereby the productivity is improved and the production cost is reduced.

BRIEF DESCRIPTION OF THE DRAWINGS

FIG. 1 is a cross-sectional diagram of an EMI (electromagnetic interference) shielding film comprising the conductive pattern according to the present invention, FIG. 2 is a schematic diagram illustrating the blackening processing, washing and drying steps of the EMI (electromagnetic interference) shielding film according to the present invention, and FIG. 3 is a cross-sectional diagram of an optical filter for a display device comprising the EMI (electromagnetic interference) shielding film according to the present invention.

| [Reference Numerals] | |
|---|---|
| 10: | Anti-reflection film |
| 20: | EMI(electromagnetic interference) shielding film |
| 21: | Substrate |
| 22: | Conductive pattern |
| 23: | Blackened layer |
| 30: | Near infrared ray shielding film |
| 40: | Color correction film |
| 50: | Plasma display panel |
| 51: | Rear panel |
| 52: | Front panel |
| 60: | First take-up roller |
| 61: | Blackening processing bath |
| 62: | Blackening processing roller |
| 63: | First guide roller |
| 64: | Washing treatment bath |
| 65: | Washing treatment roller |
| 66: | Second guide roller |
| 67: | Drying treatment bath |
| 68: | Drying treatment roller |
| 69: | Second take-up roller |

MODE FOR THE INVENTION

The method for preparing a conductive pattern, and the conductive pattern prepared therefrom, according to the present invention, have applications in various fields. Hereinbelow, in one example, the present invention will be specifically explained with reference to an EMI (electromagnetic interference) shielding film.

The EMI (electromagnetic interference) shielding film (20) according to the present invention comprises a substrate (21), a conductive pattern (22) formed on the substrate (21), and a blackened layer (23) formed on the surface of the conductive pattern (22), as shown in FIG. 1.

The EMI (electromagnetic interference) shielding film (20) is prepared by carrying out a step of preparing a substrate (21); a pattern forming step of forming conductive pattern (22) made from metal materials on a substrate (21); and a blackening processing step of blackening the surface of the conductive pattern (22) by immersing the conductive pattern (22) in an aqueous solution containing the reducing metal ions for a predetermined time. In addition, a washing step of washing the blackened conductive pattern (22); and a drying step of drying the washed conductive pattern (22) for a predetermined time can be further carried out.

The substrate (21) is made from materials having excellent adhesiveness and light transmittance, and can be formed of at least one resin selected from a polyacrylic resin, a polyurethane resin, a polyester resin, a polyepoxy resin, a polyolefilm resin, a polycarbonate resin and a cellulose resin. The substrate (21) is preferably formed of transparent PET (polyethyleneterephthalate).

In the pattern forming step, the conductive paste is printed on the substrate (21) in the off-set printing method, and a conductive pattern (22) is formed on the substrate (21). In the present Example, the off-set printing method is used in the pattern forming step of forming the conductive pattern (22) on the substrate (21), but photolithography can also be used.

Here, the conductive paste is formed by dispersing metal powders in a suitable organic solvent, and a polymeric binder can be added to the organic solvent.

The metal powders are powdered metals having high electric conductivity, and include various metals, in addition to silver, copper, gold and aluminum, among which silver powders having the lowest specific resistance are most preferred.

As the organic solvent, butyl carbitol acetate, carbitol acetate, cyclohexanone, cellosolve acetate, terpineol, or the like can be used.

The polymeric binder is added in order to function to allow the conductive paste to have a viscosity suitable for off-set printing, as well as to improve the adhesiveness between the conductive pattern (22) and the substrate (21), provided by the conductive paste. Examples of the polymeric binder include various materials similar to the substrate (21), in addition to a polyacrylic resin, a polyurethane resin, a polyester resin, a polyepoxy resin, a polyolefin resin, a polycarbonate resin, and a cellulose resin.

To specifically explain the off-set printing method for printing the conductive paste on the substrate (21), the method involves the steps of: filling a conductive paste in the concave part on a concave plate; transferring the conductive paste from the concave part of a concave plate to a printing blanket by contacting the printing blanket with the concave plate; and forming a conductive pattern (22) on the substrate (21) by contacting the printing blanket with the substrate (21), and transferring the conductive paste from the printing blanket to substrate (21).

In the step of filling the conductive paste in the concave part formed on the concave plate, the conductive paste can be injected to the concave part to fill the conductive paste in the concave part, the conductive paste is applied on the entire concave plate, and then the remaining part is scratched with a blade to leave the conductive paste only on the concave part and to fill the conductive paste in the concave part.

In the present Example, the invention is explained with reference to the concave plate off-set printing method, but a flat plate off-set printing method or a convex plate off-set printing method can be used. Further, in the present Example, the conductive paste is directly printed on the substrate (21), but another resin is coated on the substrate (21) to improve the adhesiveness between the conductive paste and the substrate (21), and then the conductive paste is printed.

As such, after completion of the pattern forming step in which the conductive pattern (22) is formed on the substrate (21) by the off-set printing method, the EMI (electromagnetic interference) shielding film (20) is wound up onto a first take-up roller (60).

Next, as shown in FIG. 2, in the blackening processing step, the conductive pattern (22) formed by the off-set printing method is immersed in an aqueous solution containing the reducing metal ions for 3 to 300 seconds. That is, the EMI (electromagnetic interference) shielding film (20) wound up onto the first take-up roller (60) is transported to the blackening processing bath (61) having an aqueous solution containing the reducing metal ions received therein via a blackening processing roller (62), and then immersed in the aqueous solution containing the reducing metal ions in the blackening processing bath (61) for 3 to 300 seconds. Thus, the surface of the conductive pattern (22) is oxidized and becomes black.

In the present invention, the conductive pattern (22) can be blackened by suitably controlling the immersion time. If the immersion time is too short, a desired degree of blackness is not easily obtained, while if the immersion time is too long, the productivity is lowered. Accordingly, the immersion time is 3 to 300 seconds, more preferably 10 to 60 seconds.

As such, the EMI (electromagnetic interference) shielding film (20) which has been completely blackened in the blackening processing bath (61), as shown in FIG. 2, is guided to a washing step using a washing treatment bath (64) by a first guide roller (63), and the EMI (electromagnetic interference) shielding film (20) is introduced to the washing treatment bath (64) having a washing liquid received therein by a washing treatment roller (65), and then washed therein.

The EMI (electromagnetic interference) shielding film (20) washed in the washing treatment bath (64) is guided to a drying step using a drying treatment bath (67) by a second guide roller (66), and the EMI (electromagnetic interference) shielding film (20) is introduced to the drying treatment bath (67) by a drying treatment roller (68), dried therein, and finally wound up onto a second take-up roller (69) for storage.

In the drying step, drying is preferably carried out at a drying temperature of 50 to 120° C. for 3 to 10 minutes, most preferably at 70° C. for 5 minutes. If the drying temperature is excessively higher than 120° C., the substrate (21) of the EMI (electromagnetic interference) shielding film (20) may be deformed, while if the drying temperature is excessively lower than 50° C., the drying time becomes longer, whereby the productivity may be deteriorated.

In the drying step, the drying treatment bath (67) may be provided in the form of an oven for directly applying heat onto the EMI (electromagnetic interference) shielding film (20), or in the form of a hot-air spray device for spraying hot air onto the eEMI (electromagnetic interference) shielding film (20). Alternatively, the drying treatment bath (67) may be provided in the form of a heater in which the drying treatment roller (68) in the drying treatment bath (67) emits heat itself, but not limited thereto.

Hereinafter, the present invention will be described in detail with reference to Examples. However, it should not be construed that the scope of the invention is limited to Examples.

In the following Examples, a silver(Ag) conductive pattern is used as the conductive pattern (22), and an aqueous $FeCl_3$ solution, an aqueous $K_3Fe(CN)_6$ solution, and an aqueous $CuCl_2$ solution are used as the aqueous solutions comprising the reducing metal ions. The degrees of blackness (L values) and the sheet resistances ($\Omega/\square$) are summarized in Table 1.

Example 1

3 g of $FeCl_3$ and 50 g of water were mixed to prepare an aqueous $FeCl_3$ solution, and a silver(Ag) conductive pattern was immersed in the aqueous FeCl solution for 30 seconds.

Example 2

3 g of $K_3Fe(CN)_6$ and 50 g of water were mixed to prepare an aqueous $K_3Fe(CN)_6$ solution, and a silver(Ag) conductive pattern was immersed in the aqueous $K_3Fe(CN)_6$ solution for 30 seconds.

Example 3

3 g of $CuCl_2$ and 50 g of water were mixed to prepare an aqueous $CuCl_2$ solution, and a silver(Ag) conductive pattern was immersed in the aqueous $CuCl_2$ solution for 30 seconds.

TABLE 1

|  | Solution for blackening processing | Sheet resistance before treatment ($\Omega/\square$) | Sheet resistance after treatment ($\Omega/\square$) | Degree of blackness before treatment(L values) | Degree of blackness after treatment(L values) |
| --- | --- | --- | --- | --- | --- |
| Example 1 | $FeCl_3$ | 0.35 | 0.17 | 66.6 | 31.8 |
| Example 2 | $K_3Fe(CN)_6$ | 0.35 | 0.33 | 63.8 | 37.6 |
| Example 3 | $CuCl_3$ | 0.35 | 0.21 | 66.3 | 27.1 |

Here, after blackening processing, the sheet resistance is increased, and the conductive pattern exhibits high sheet resistance, meaning that the conductance is lowered, and the EMI (electromagnetic interference) shielding ability is also lowered. As shown in Table 1, in Examples 1 to 3, the sheet resistance of the silver(Ag) conductive pattern before blackening processing was $0.35\Omega/\square$. On the other hand, in the case of forming AgCl crystals as the blackened layer (23) in the silver(Ag) conductive pattern (22) by immersing the silver (Ag) conductive pattern in the solution for blackening processing according to Examples 1 to 3 for 30 seconds, it was confirmed that the sheet resistance was not increased, and the sheet resistance was decreased to 0.17, 0.33, and $0.21\Omega/\square$, respectively.

Moreover, the smaller degrees of blackness (L values) mean the greater intensities of blackness. As shown in Table 1, in Examples 1 to 3, the degrees of blackness (L value) of the silver(Ag) conductive pattern after blackening processing were remarkably decreased to 31.8, 37.6, and 27.1, as compared with 66.6, 63.8, and 66.3 of the degrees of blackness (L value) of the silver(Ag) conductive pattern before blackening processing. From this, it was confirmed that the silver(Ag) conductive pattern (22) is sufficiently blackened.

On the other hand, as described below, the blackening processing method by chemical treatment of a conductive pattern with a concentrated nitric acid solution as Comparative Examples, in comparison to the present invention, will be explained.

Comparative Example

A concentrated nitric acid solution comprising 10% by weight of nitric acid and balance q. s. to 100% by weight of water, based on the total weight, was prepared. Then, a silver (Ag) conductive pattern was immersed in the concentrated nitric acid solution for 30 seconds, and the results thereof are shown in Table 2.

TABLE 2

|  | Solution for blackening processing | Sheet resistance before treatment ($\Omega/\square$) | Sheet resistance after treatment ($\Omega/\square$) | Degree of blackness before treatment (L value) | Degree of blackness after treatment (L value) |
| --- | --- | --- | --- | --- | --- |
| Comparative Example | $HNO_3$ | 0.35 | 0.44 | 67.2 | 55.5 |

As shown in Table 2, if the silver(Ag) conductive pattern was immersed in the concentrated nitric acid solution for 30 seconds and then blackened, the degree of blackness (L value) was 55.5, and the pattern was not sufficiently blackened, as compared with 67.2 of the degree of blackness (L value) before blackening processing with the concentrated nitric acid solution. Further, it is also found that the values were larger, as compared with 31.8, 37.6, and 27.1 of the degrees of blackness (L values) in Examples 1 to 3 of the present invention. That is, if the concentrated nitric acid solution was used, the pattern was not sufficiently blackened, as compared with the present invention. Further, even if the pattern was immersed in the concentrated nitric acid solution for 20 minutes or longer, it was not likely to obtain a desired degree blackness.

Moreover, in Examples 1 to 3 of the present invention, an aqueous solution containing the reducing metal ions such as an aqueous $FeCl_3$ solution, an aqueous $CuCl_2$ solution and an aqueous $K_3Fe(CN)_6$ solution was used, the sheet resistance after blackening processing was reduced. On the other hand, from Table 2, it was confirmed that if blackening processing with a concentrated nitric acid solution is carried out, the sheet resistance was significantly increased from $0.35\Omega/\square$ of the sheet resistance before blackening processing to $0.44\Omega/\square$ of the sheet resistance after blackening processing.

Therefore, if a silver(Ag) conductive pattern is immersed in an aqueous solution containing the reducing metal ions for an appropriate time, and then the silver(Ag) conductive pattern is subject to blackening processing according to the present invention, the sheet resistance after blackening processing is not higher than that before blackening processing, and the sheet resistance is also reduced, whereby the silver (Ag) conductive pattern can be sufficiently blackened, and a further enhanced degree of blackness can be obtained, as compared with that by the blackening processing method of the silver(Ag) conductive pattern using a concentrated nitric acid solution.

Particularly, in the case of an aqueous solution containing Fe or Cu ions as the reducing metal ions, if the surface of the silver(Ag) conductive pattern is oxidized by reduction of Fe or Cu, a lower degree of blackness (L value) can be obtained. That is, the pattern can be significantly blackened. Further, if the aqueous solution further contains Cl ions, AgCl crystals are formed on the surface of the silver(Ag) conductive pattern by the Cl ions, and thus the size of the conductive crystal (AgCl crystals) is increased, whereby the sheet resistance is not increased, but decreased. As such, as the sheet resistance of the conductive pattern is reduced, the conductance is enhanced, whereby the EMI (electromagnetic interference) shielding ability can be enhanced.

Further, according to the present invention, a conductive paste is printed on the substrate (21) by an off-set printing method, the conductive pattern (22) can be conveniently formed on the substrate (21), allowing easy preparation of the conductive pattern, whereby the productivity is enhanced, and the production cost is reduced.

Moreover, by successively carrying out the blackening processing step, the washing step, and the drying step on a plurality of rollers, blackening processing of conductive pattern (22) becomes easier, whereby the productivity can be enhanced, and the production cost can be reduced.

On the other hand, the EMI (electromagnetic interference) shielding film (20) prepared by the above-described preparation method can be applied on the optical filter (100) disposed in front of the display panel of a display device.

In one example, as shown in FIG. 3, the optical filter (100) disposed in front of the plasma display panel (50) having a rear panel (51) and a front panel (52), comprises a color correction film (40) for enhancing the color purity through control of the shade by incorporation of a color adjusting dye; a near infrared ray shielding film (30) laminated on the color correction film (40), for shielding the near infrared ray generated in the plasma display panel (50) for prevention of misoperation of an electronic instrument such as a remote controller; an EMI (electromagnetic interference) shielding film (20) according to the present invention laminated on the near infrared ray shielding film (30), for shielding the EMI (electromagnetic interference) generated in the plasma display panel (50); and an anti-reflection film (10) laminated on the EMI (electromagnetic interference) shielding film (20), for preventing the external light incident from the outside from be reflected outward again.

Accordingly, if the optical filter (100) applied with the EMI (electromagnetic interference) shielding film (20) according to the present invention is disposed in front of the plasma display panel (50), the light emitted from the plasma display panel (50) by gloss of the conductive pattern made from the metallic materials and the outer light are reflected, whereby reduction of the contrast ratio of the display device is prevented by a blackened layer (23) formed on the conductive pattern (22) of the EMI (electronmagnetic interference) shielding film (20).

Herein, the display panel is described with reference to the plasma display panel (50), but is not limited thereto. Further, for the optical filter (100) to be disposed in front of the plasma display panel (50), it is described that the color correction film (40), the near infrared ray shielding film (30), the EMI (electromagnetic interference) shielding film (20), and the anti-reflection film (10) are laminated in this order, but the lamination order is not limited thereto.

The invention claimed is:

1. A method for preparing a conductive pattern, comprising a pattern forming step of forming a silver conductive pattern formed by directly printing a conductive paste comprising silver powders on a substrate; and
a blackening processing step of blackening a surface of the silver conductive pattern by immersing the silver conductive pattern in an aqueous solution containing reducing metal ions to oxidize the surface of the silver conductive pattern,
wherein the aqueous solution containing the reducing metal ions is selected from an aqueous $FeCl_3$ solution, an aqueous $CuCl_2$ solution and an aqueous $K_3Fe(CN)_6$ solution.

2. The method for preparing a conductive pattern according to claim 1, wherein the aqueous solution containing the reducing metal ions is an aqueous solution containing Fe or Cu ions.

3. The method for preparing a conductive pattern according to claim 1, wherein the aqueous solution containing the reducing metal ions further contains Cl ions.

4. The method for preparing a conductive pattern according to claim 3, wherein in the blackening processing step, the silver conductive pattern is immersed in the aqueous solution containing Cl ions and the reducing metal ions to form chlorine salt crystals on the surface of the silver conductive pattern.

5. The method for preparing a conductive pattern according to claim 1, wherein the aqueous $FeCl_3$ solution comprises 0.01 to 50% by weight of $FeCl_3$ and balance quantum sufficit to 100% by weight of water, based on a total weight of the aqueous $FeCl_3$ solution.

6. The method for preparing a conductive pattern according to claim 1, wherein the aqueous $CuCl_2$ solution comprises 0.01 to 50% by weight of $CuCl_2$ and balance quantum sufficit to 100% by weight of water, based on a total weight of the aqueous $CuCl_2$ solution.

7. The method for preparing a conductive pattern according to claim 1, wherein the aqueous $K_3Fe(CN)_6$ solution comprises 0.01 to 50% by weight of $K_3Fe(CN)_6$ and balance quantum sufficit to 100% by weight of water, based on a total weight of the aqueous $K_3Fe(CN)_6$ solution.

8. The method for preparing a conductive pattern according to claim 1, wherein the aqueous $K_3Fe(CN)_6$ solution is further added with a solution containing Cl ions.

9. The method for preparing a conductive pattern according to claim 8, wherein the $K_3Fe(CN)_6$ aqueous solution comprises 0.01 to 50% by weight of $K_3Fe(CN)_6$, 0.01 to 50% by weight of the solution containing Cl ions, and balance quantum sufficit to 100% by weight of water, based on a total weight of the $K_3Fe(CN)_6$ aqueous solution.

10. The method for preparing a conductive pattern according to claim 1, wherein the aqueous solution containing the reducing metal ions further contains Cl ions; and
in the blackening processing step, the silver conductive pattern is immersed in the aqueous solution containing Cl ions and the reducing metal ions to form AgCl crystals on the surface of the silver conductive pattern.

11. The method for preparing a conductive pattern according to claim 10, wherein the aqueous solution containing Cl ions and the reducing metal ions is selected from an aqueous $FeCl_3$ solution, an aqueous $CuCl_2$ solution and an aqueous $K_3Fe(CN)_6$ solution with added Cl ions.

12. The method for preparing a conductive pattern according to claim 1, wherein the conductive pattern is a silver conductive pattern formed by directly printing a conductive paste comprising silver powders on the substrate;
the aqueous solution containing the reducing metal ions further comprises Cl ions; and
in the blackening processing step, the silver conductive pattern is immersed in the aqueous solution containing Cl ions and the reducing metal ions to form AgCl crystals on the surface of the silver conductive pattern.

13. A conductive pattern, comprising
a silver conductive pattern layer formed by directly printing a conductive paste comprising silver powders on a substrate; and
a blackened layer formed on the surface of the silver conductive pattern layer by immersing the silver conductive pattern layer in an aqueous solution containing reducing metal ions for oxidizing the surface of the silver conductive pattern layer,
wherein the aqueous solution containing the reducing metal ions is selected from an aqueous $FeCl_3$ solution, an aqueous $CuCl_2$ solution and an aqueous $K_3Fe(CN)_6$ solution.

14. The conductive pattern according to claim 13, wherein the aqueous solution containing the reducing metal ions is an aqueous solution containing Fe or Cu ions.

15. The conductive pattern according to claim 13, wherein the aqueous solution containing the reducing metal ions further comprises Cl ions, and the blackened layer is a chlorine salt crystal formed on the surface of the silver conductive pattern layer by the Cl ions of the aqueous solution containing Cl ions and the reducing metal ions.

16. The conductive pattern according to claim 15, wherein the aqueous solution containing Cl ions and the reducing metal ions comprises Fe or Cu ions.

17. The conductive pattern according to claim 13, wherein the aqueous $K_3Fe(CN)_6$ solution is further added with a solution containing Cl ions.

18. The conductive pattern according to claim 13,
wherein the aqueous solution containing the reducing metal ions further comprises Cl ions, and
the blackened layer is an AgCl crystal formed on the surface of the silver conductive pattern layer by the Cl ions of the aqueous solution containing Cl ions and the reducing metal ions.

19. The conductive pattern according to claim 13, wherein the conductive pattern layer is a silver conductive pattern layer obtained by directly printing a conductive paste comprising silver powders on the substrate,
the aqueous solution containing the reducing metal ions further comprises Cl ions, and the blackened layer is an AgCl crystal formed on the surface of the silver conductive pattern layer by the Cl ions of the aqueous solution containing Cl ions and the reducing metal ions.

20. An EMI (electromagnetic interference) shielding film comprising the conductive pattern according to claim 13.

21. An optical filter for display device comprising the EMI (electromagnetic interference) shielding film according to claim 20.

* * * * *